(12) United States Patent
Huang et al.

(10) Patent No.: US 10,141,925 B1
(45) Date of Patent: Nov. 27, 2018

(54) CIRCUITS AND METHODS FOR STRENGTHENING LOAD TRANSIENT RESPONSE COMPENSATION

(71) Applicant: Wistron Corp., New Taipei (TW)

(72) Inventors: Chengwei Huang, New Taipei (TW);
Sin-Fang Wang, New Taipei (TW);
Yen-Hsiang Wang, New Taipei (TW);
Jiun-Lin Tseng, New Taipei (TW);
Po-Yen Huang, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 15/868,493

(22) Filed: Jan. 11, 2018

(30) Foreign Application Priority Data

Oct. 27, 2017 (TW) .............................. 106137096 A

(51) Int. Cl.
*H03K 17/66* (2006.01)
*H03K 17/10* (2006.01)
*H03K 19/003* (2006.01)

(52) U.S. Cl.
CPC .......... *H03K 17/668* (2013.01); *H03K 17/102* (2013.01); *H03K 19/00361* (2013.01)

(58) Field of Classification Search
CPC ............. Y10T 307/305; Y10T 307/313; Y10T 307/32; Y10T 307/328; Y10T 307/344; Y10T 307/359; Y10T 307/383; Y10T 307/391; Y10T 307/50; H03K 17/10; H03K 17/102; H03K 17/122; H03K 17/16; H03K 17/161; H03K 17/30; H03K 17/302; H03K 19/003; H03K 19/00307; H03K 19/00315; H03K 19/00346; H03K 19/00353; H03K 17/107; H03K 17/60; H04L 25/026

USPC ....... 307/43–46, 84; 327/108–112, 535–537; 323/313–317

See application file for complete search history.

(56) References Cited

U.S. PATENT DOCUMENTS 7,973,595 B2 * 7/2011 Kimura ................... H02J 9/061
327/530
2002/0113494 A1 * 8/2002 Winick ................... H02J 1/108
307/85

FOREIGN PATENT DOCUMENTS

CN 202995616 U 6/2013

* cited by examiner

*Primary Examiner* — Nguyen Tran
(74) *Attorney, Agent, or Firm* — McClure, Qualey & Rodack, LLP

(57) ABSTRACT

A circuit for strengthening load transient response compensation is provided, including a comparator, a first MOSFET and a second MOSFET. The comparator compares a system voltage of an electronic device with a reference voltage. The first MOSFET is coupled to the comparator and a first power supply. The second MOSFET is coupled to the comparator and a second power supply of the electronic device. When an external device is connected to the electronic device such that the system voltage is lower than the reference voltage, the comparator outputs a low-level signal and the first MOSFET becomes conductive, so that the external device is powered by the first power supply.

6 Claims, 4 Drawing Sheets

CIRCUITS AND METHODS FOR STRENGTHENING LOAD TRANSIENT RESPONSE COMPENSATION

CROSS REFERENCE TO RELATED APPLICATIONS

This Application claims priority of Taiwan Patent Application No. 106137096, filed on Oct. 27, 2017, the entirety of which is incorporated by reference herein.

BACKGROUND OF THE INVENTION

Field of the Invention

The present invention relates to a circuit and a method for strengthening load transient response compensation, and more particularly, to a circuit and a method for strengthening load transient response compensation that an external device is powered by a capacitor when a connection of the external device causes a system voltage to be lower than a reference voltage.

Description of the Related Art

When a user connects an external device (such as a hot swapping device) to an electronic device, a current surge may be generated, which may cause the floating of the system voltage of the electronic device. When the current is too large, the operating voltage may be reduced, which may result in the operating voltage being lower than the system requirements, and cause malfunctioning or resetting of the system and the electronic device. Therefore, how to quickly switch the power supply responding to a current surge when the system voltage of the electronic device is reduced is currently a problem to be solved.

BRIEF SUMMARY OF INVENTION

An embodiment of the present invention provides circuit for strengthening load transient response compensation, including a comparator, a first MOSFET, and a second MOSFET. The comparator compares a system voltage of an electronic device with a reference voltage. The first MOSFET is coupled to the comparator and a first power supply. The second MOSFET is coupled to the comparator and a second power supply of the electronic device. When an external device is connected to the electronic device such that the system voltage is lower than the reference voltage, the comparator outputs a low-level signal and the first MOSFET becomes conductive, so that the external device is powered by the first power supply.

Another embodiment of the present invention provides a method of strength load transient response compensation, including the steps of: providing, via an electronic device, a system voltage; connecting an external device with the electronic device; comparing, via a comparator, the system voltage with a reference voltage, and generating a comparison result; and conducting a first MOSFET or a second MOSFET according to the comparison result such that the external device is powered by a first power supply or a second power supply of the electronic device. When the system voltage is lower than the reference voltage, the comparator outputs a low-level signal and the first MOSFET becomes conductive, so that the external device is powered by the first power supply.

According to an embodiment of the present invention, when the system voltage is higher than the reference voltage, the comparator outputs a high-level signal and the second MOSFET becomes conductive, so that the external device is powered by the second power supply.

According to an embodiment of the present invention, the first power supply is a supercapacitor, and when the second MOSFET becomes conductive, the second power supply charges the supercapacitor at the same time.

According to an embodiment of the invention, the reference voltage is provided by a low-dropout regulator.

According to an embodiment of the invention, the first MOSFET comprises a first gate, a first drain and a first source, the first gate is coupled to an output terminal of the comparator, the first drain is coupled to the external device, the second power supply and a first terminal of a resistor, and the first source is coupled to a first terminal of a capacitor and a second terminal of the resistor, and wherein the second MOSFET comprises a second gate, a second drain and a second source, the second gate is coupled to the output terminal of the comparator, the second drain is coupled to an operating voltage and the second source is coupled to the first drain, the second power supply, the first terminal of the resistor and the external device.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Further areas to which the present of a circuit and a method for strengthening load transient response compensation can be applied will become apparent from the detailed description provided herein. It should be understood that the detailed description and specific examples, while indicating exemplary embodiments of a circuit and a method for strengthening load transient response compensation, are intended for the purposes of illustration only and are not intended to limit the scope of the invention.

Figure 1:
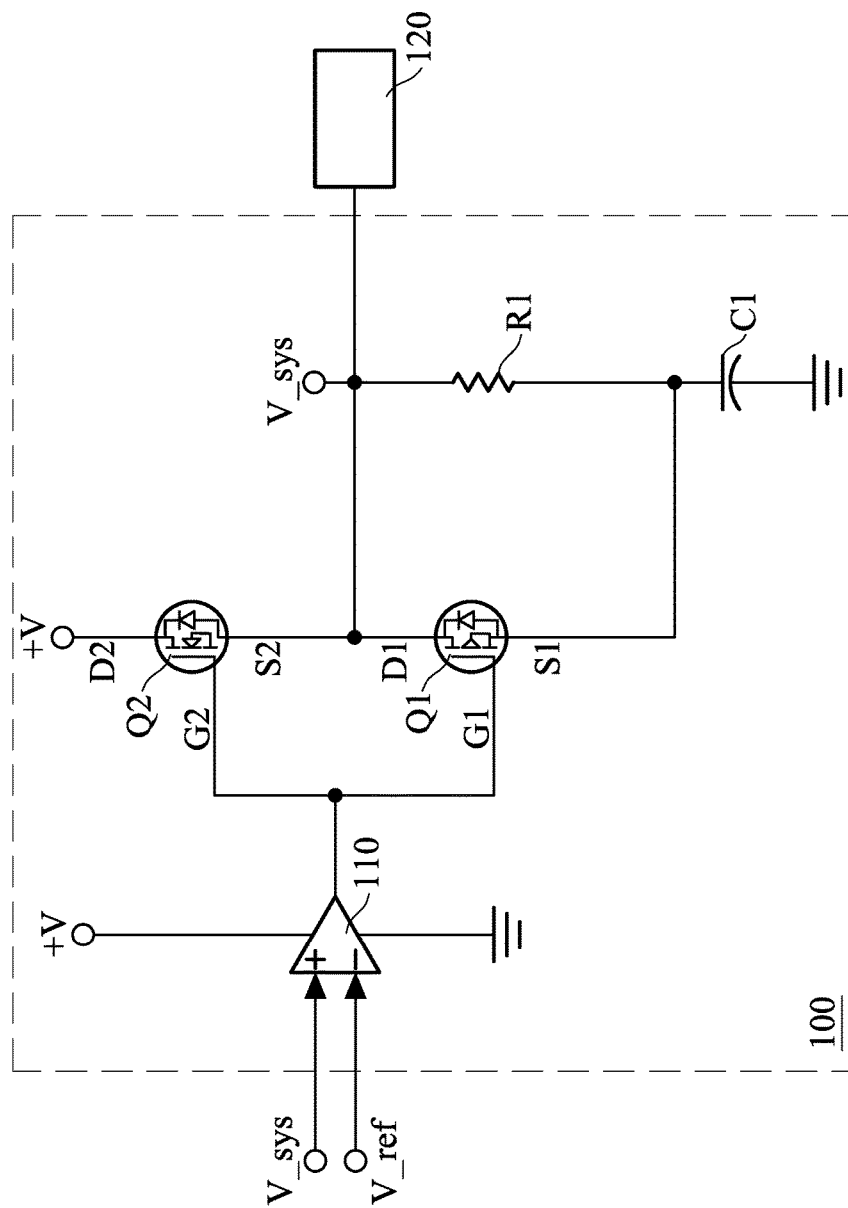
FIG. 1 is a diagram of a circuit for strengthening load transient response compensation in accordance with an embodiment of the present invention.

FIG. 1 is a diagram of a circuit for strengthening load transient response compensation in accordance with an embodiment of the present invention. In this embodiment, the circuit 100 for strengthening load transient response compensation is coupled between an electronic device and an external device 120, and includes a comparator 110, a first MOSFET Q1, a second MOSFET Q2, a resistor R1 and a capacitor C1. The comparator 110 includes a non-inverting input terminal, an inverting input terminal and an output terminal. The non-inverting input terminal receives a system voltage V_sys of the electronic device (not shown), the inverting input terminal receives a reference voltage V_ref, and the output terminal outputs a high-level signal or a low-level signal according to the comparison result of the system voltage V_sys and the reference voltage V_ref. The first MOSFET Q1 includes a first gate G1, a first drain D1, and a first source S1. The first gate G1 is coupled to the output terminal of the comparator 110, the first drain D1 is coupled to the external device 120, a second power supply V_sys and a first terminal of the resistor R1, and the first source S1 is coupled to a first terminal of the capacitor C1 and a second terminal of the resistor R1. As described herein, the second power supply V_sys is equal to the system voltage V_sys. The second MOSFET Q2 includes a second gate G2, a second drain D2 and a second source S2. The second gate G2 is coupled to the output terminal of the comparator 110, the second drain D2 is coupled to an operating voltage +V, and the second source S2 is coupled to the first drain D1, the second power supply V_sys, the first terminal of the resistor R1 and the external device 120. A second terminal of the capacitor C1 is coupled to the ground.

Figure 2A:
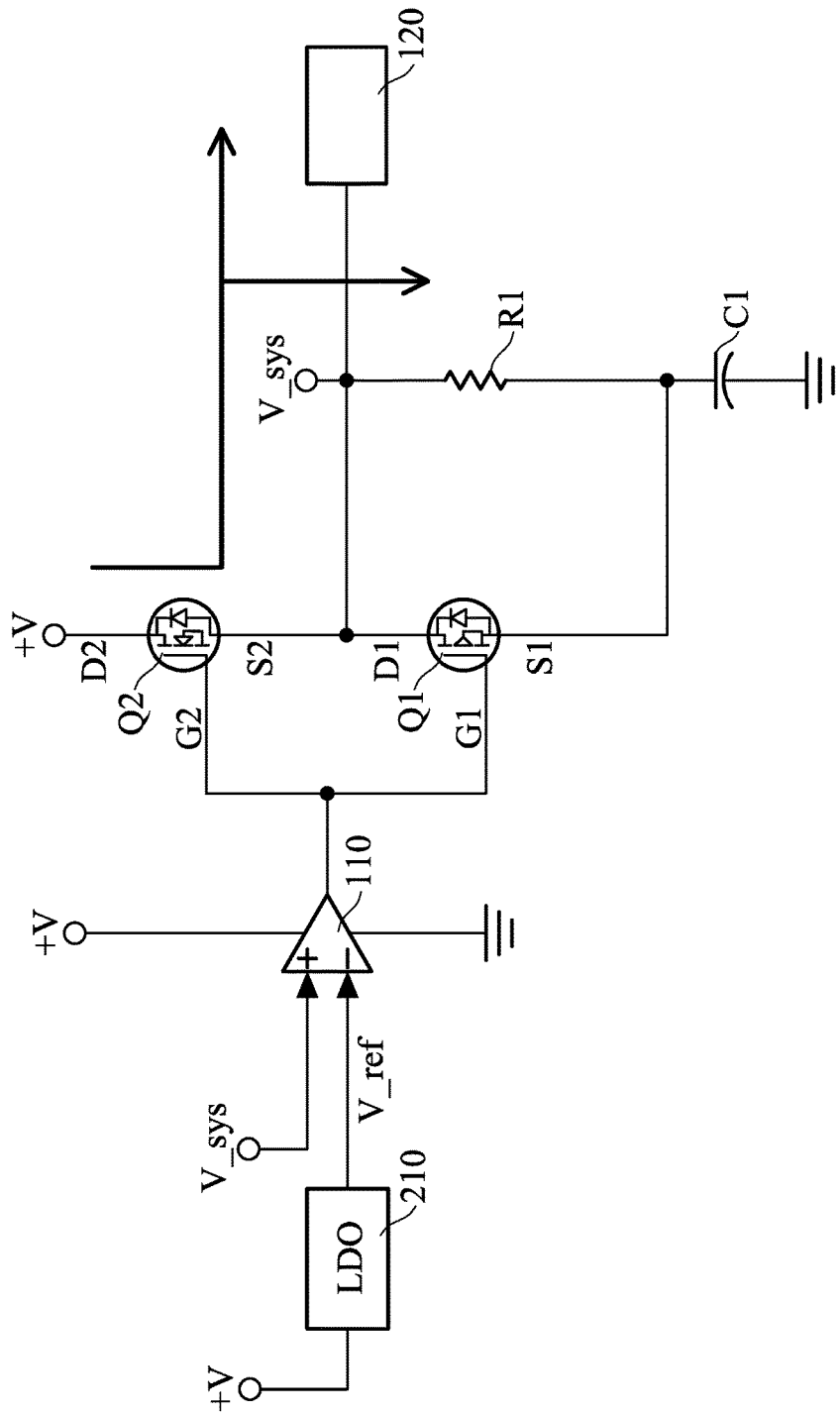
FIG. 2A is a schematic diagram of that the load is powered by the power supply of the electronic device in accordance with an embodiment of the present invention.

FIG. 2A is a schematic diagram of that the load is powered by the power supply of the electronic device in accordance with an embodiment of the present invention. In this embodiment, the reference voltage V_ref is provided by a low-dropout regulator (LDO) 210, and the reference voltage V_ref is lower than the system voltage V_sys provided by the system when it is operating normally. Because the low-dropout regulator provides a stable DC power, when the system voltage V_sys of the electronic device is affected by external devices or other factors, the reference voltage V_ref provided by the low-dropout regulator will not be floated with the system voltage V_sys, so that accuracy will be improved for preventing the false action of the system. In addition, the capacitor C1 is a supercapacitor used as another power supply of the electronic device. When the electronic device is operating in a normal state, the system voltage V_sys is higher than the reference voltage V_ref. Therefore, the output terminal of the comparator 110 outputs a high-level signal, so that the second MOSFET Q2 becomes conductive and the first MOSFET becomes non-conductive, which means the capacitor C1 is directly charged by the second power supply V_sys of the electronic device.

Figure 2B:
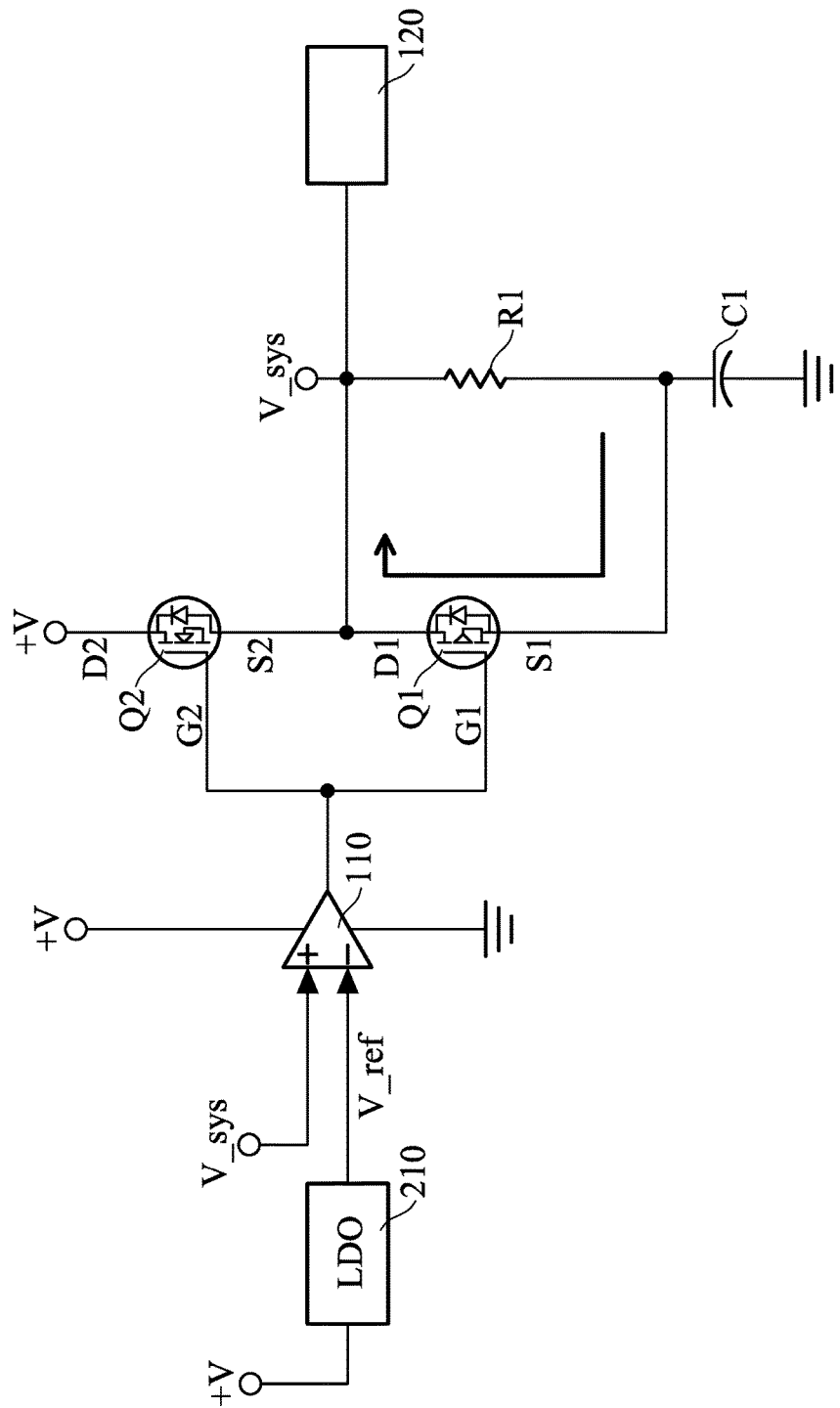
FIG. 2B is a schematic diagram of that the load is powered by the supercapacitor in accordance with an embodiment of the present invention.

FIG. 2B is a schematic diagram of that the load is powered by the supercapacitor in accordance with an embodiment of the present invention. When the external device is connected to the electronic device, since the increase of load may cause current surge, which will result in the reduction of the system voltage, and the system voltage V_sys will be lower than the reference voltage V_ref. That is, the output terminal of the comparator 110 will then output the low-level signal, which makes the first MOSFET Q1 conductive, and the second MOSFET Q2 is non-conductive. In this way, the external device 120 is powered by the capacitor C1 (as shown by the arrow in FIG. 2B), so as to prevent the electronic device from having an unexpected risk due to the reduction of the operating voltage.

Returning to FIG. 2A, when the output of the electronic device becomes stable, the system voltage V_sys will rise back to the voltage that corresponds to the normal state, which means the system voltage V_sys will be higher than the reference voltage V_ref. Then, the comparator 110 outputs the high-level signal again, so that the second MOSFET Q2 becomes conductive, and the MOSFET Q1 is non-conductive. Therefore, the external device 120 is powered by the second power supply V_sys of the electronic device, and also the capacitor C1 is charged by the second power supply V_sys at the same time.

Figure 3:
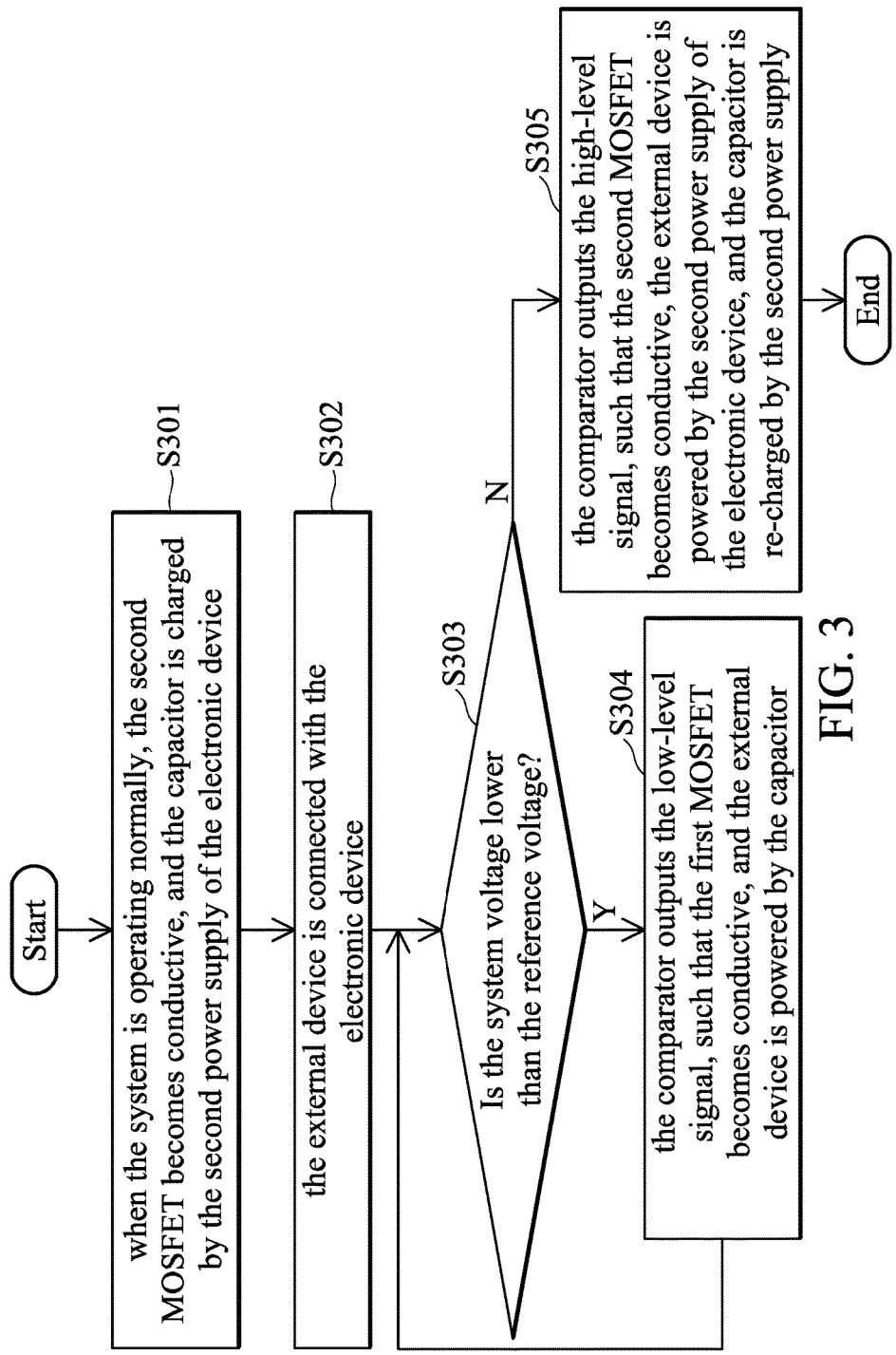
FIG. 3 is a flow chart of a method for strengthening load transient response compensation in accordance with an embodiment of the present invention.

FIG. 3 is a flow chart of a method for strengthening load transient response compensation in accordance with an embodiment of the present invention. In step S301, when the system is operating normally, the system voltage V_sys is higher than the reference voltage V_ref, and the comparator 110 outputs the high-level signal through the output terminal of the comparator 110, so that the second MOSFET Q2 becomes conductive and the first MOSFET Q1 is non-conductive, and the capacitor C1 is charged by the second power supply of the electronic device. In step S302, the external device is connected with the electronic device by the user. In this case, since the connection of the external device may generate the current surge, which may result in the reduction of the system voltage V_sys, the comparator 110 determines whether the system voltage V_sys is lower than the reference voltage V_ref in step S303. When the system voltage V_sys is lower than the reference voltage V_ref, the method proceeds to step S304, the comparator 110 outputs the low-level signal, such that the first MOSFET 104 becomes conductive, and the external device 120 is powered by the capacitor C1. On the other hand, when the system voltage V_sys becomes stable, the system voltage V_sys will be higher than the reference voltage V_ref, the method proceeds to step S305, the comparator 110 outputs the high-level signal, so that the second MOSFET Q2 becomes conductive. That is, the external device 120 is powered by the second power supply V_sys of the electronic device, and the capacitor C1 is re-charged by the second power supply V_sys again.

In conclusion, according to the circuit and the method for strengthening load transient response compensation provided by the embodiments of the present invention, when the system voltage of the electronic device is lower than the reference voltage due to the connection of the external device, the power supply of the external device can be quickly switched to the supercapacitor based on the comparison result of the comparator. Therefore, the large current required for the connection of the external device will be met, and the malfunction or the reset of the system and/or the electronic device due to the sudden drop of the system voltage can also be avoided. In addition, when the load of the external device resumes to the normal state, the power supply can be switched to the electronic device based on the comparison result of the comparator, and the capacitor can also be re-charged by the electronic device again for the next use.

It will be apparent to those skilled in the art that various modifications and variations can be made to the structure disclosed without departing from the scope or spirit of the invention. In view of the foregoing, it is intended that the present invention covers modifications and variations of this invention, provided they fall within the scope of the following claims and their equivalents.

What is claimed is:

1. A circuit for strengthening load transient response compensation, comprising:
   a comparator, comparing a system voltage of an electronic device with a reference voltage;
   a first MOSFET, coupled to the comparator and a first power supply;
   a second MOSFET, coupled to the comparator and a second power supply of the electronic device;
   wherein when an external device is connected to the electronic device such that the system voltage is lower than the reference voltage, the comparator outputs a low-level signal and the first MOSFET becomes conductive, so that the external device is powered by the first power supply;

wherein when the system voltage is higher than the reference voltage, the comparator outputs a high-level signal and the second MOSFET becomes conductive, so that the external device is powered by the second power supply; and wherein the first power supply is a supercapacitor, and when the second MOSFET becomes conductive, the second power supply charges the supercapacitor at the same time.

2. The circuit as claimed in claim 1, wherein the reference voltage is provided by a low-dropout regulator.

3. The circuit as recited in claim 1, wherein the first MOSFET comprises a first gate, a first drain and a first source, the first gate is coupled to an output terminal of the comparator, the first drain is coupled to the external device, the second power supply and a first terminal of a resistor, and the first source is coupled to a first terminal of a capacitor and a second terminal of the resistor, and wherein the second MOSFET comprises a second gate, a second drain and a second source, the second gate is coupled to the output terminal of the comparator, the second drain is coupled to an operating voltage and the second source is coupled to the first drain, the second power supply, the first terminal of the resistor and the external device.

4. A method of strengthening load transient response compensation, comprising:

providing, via an electronic device, a system voltage;

connecting an external device with the electronic device;

comparing, via a comparator, the system voltage with a reference voltage, and generating a comparison result;

conducting a first MOSFET or a second MOSFET according to the comparison result such that the external device is powered by a first power supply or a second power supply of the electronic device;

wherein when the system voltage is lower than the reference voltage, the comparator outputs a low-level signal and the first MOSFET becomes conductive, so that the external device is powered by the first power supply;

wherein when the system voltage is higher than the reference voltage, the comparator outputs a high-level signal and the second MOSFET becomes conductive, so that the external device is powered by the second power supply; and wherein the first power supply is a supercapacitor, and when the second MOSFET becomes conductive, the second power supply charges the supercapacitor at the same time.

5. The method as claimed in claim 4, wherein the reference voltage is provided by a low-dropout regulator.

6. The method as claimed in claim 4, wherein the first MOSFET comprises a first gate, a first drain and a first source, the first gate is coupled to an output terminal of the comparator, the first drain is coupled to the external device, the second power supply and a first terminal of a resistor, and the first source is coupled to a first terminal of a capacitor and a second terminal of the resistor, and wherein the second MOSFET comprises a second gate, a second drain and a second source, the second gate is coupled to the output terminal of the comparator, the second drain is coupled to an operating voltage and the second source is coupled to the first drain, the second power supply, the first terminal of the resistor and the external device.

* * * * *